United States Patent
Wills et al.

(10) Patent No.: US 12,191,113 B2
(45) Date of Patent: Jan. 7, 2025

(54) SYSTEMS AND METHODS FOR OPTIMIZING FULL HORIZONTAL SCANNED BEAM DISTANCE

(71) Applicant: Applied Materials, Inc., Santa Clara, CA (US)

(72) Inventors: Tyler Wills, Marblehead, MA (US); George M. Gammel, Marblehead, MA (US); Eric Donald Wilson, Rockport, MA (US); Jay T. Scheuer, Rowley, MA (US); Xiangdong He, Westborough, MA (US); Shardul Patel, North Reading, MA (US); Robert C. Lindberg, Rockport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 365 days.

(21) Appl. No.: 17/827,204

(22) Filed: May 27, 2022

(65) Prior Publication Data

US 2023/0386785 A1 Nov. 30, 2023

(51) Int. Cl.
*H01J 37/304* (2006.01)
*H01J 37/317* (2006.01)

(52) U.S. Cl.
CPC ...... *H01J 37/3045* (2013.01); *H01J 37/3171* (2013.01); *H01J 2237/24405* (2013.01);
(Continued)

(58) Field of Classification Search
CPC ............. H01J 37/3045; H01J 37/3171; H01J 2237/24405; H01J 2237/30477;
(Continued)

(56) References Cited

U.S. PATENT DOCUMENTS

2007/0120073 A1  5/2007  Peng
2013/0256566 A1*  10/2013  Kariya ................. H01J 37/304
                                                                 250/492.21
(Continued)

FOREIGN PATENT DOCUMENTS

JP    2013206833 A    10/2013
TW    201705182 A     2/2017
TW    202109600 A     3/2021

OTHER PUBLICATIONS

International Search Report and Written Opinion for the International Application No. PCT/US2023/021937, mailed Sep. 5, 2023, 9 pages.

*Primary Examiner* — David E Smith
*Assistant Examiner* — Christopher J Gassen
(74) *Attorney, Agent, or Firm* — KDW FIRM PLLC

(57) ABSTRACT

Provided herein are approaches for optimizing a full horizontal scanned beam distance of an accelerator beam. In one approach, a method may include positioning a first Faraday cup along a first side of an intended beam-scan area, positioning a second Faraday cup along a second side of the intended beam-scan area, scanning an ion beam along the first and second sides of the intended beam-scan area, measuring a first beam current of the ion beam at the first Faraday cup and measuring a second beam current of the ion beam at the second Faraday cup, and determining an optimal scan distance of the ion beam across the intended beam-scan area based on the first beam current and the second beam current.

20 Claims, 8 Drawing Sheets

(52) U.S. Cl.
CPC ............ *H01J 2237/30477* (2013.01); *H01J 2237/30483* (2013.01)

(58) Field of Classification Search
CPC ... H01J 2237/30483; H01J 2237/31701; H01J 37/304; H01J 2237/24535; H01J 2237/3114; H01J 2237/3151
See application file for complete search history.

(56) References Cited

U.S. PATENT DOCUMENTS

| | | |
|---|---|---|
| 2015/0214005 A1 | 7/2015 | Satoh |
| 2016/0189928 A1 | 6/2016 | Vanderberg |
| 2020/0388465 A1 | 12/2020 | Lai |

* cited by examiner

SYSTEMS AND METHODS FOR OPTIMIZING FULL HORIZONTAL SCANNED BEAM DISTANCE

FIELD OF THE DISCLOSURE

The disclosure relates generally to ion beam processing techniques and, more particularly, to systems and methods for optimizing a full horizontal scanned beam distance.

BACKGROUND OF THE DISCLOSURE

In the present day, various types of processing apparatuses are employed to treat or process substrates with ions. For processing substrates such as semiconductor substrates, ions may be used to etch layers or features on a substrate. Ions may also be used to deposit a layer or structures on a substrate, to implant a species into a substrate, or to amorphize a substrate. Techniques have also been developed to monitor processing of a substrate in order to control the processing of a substrate.

Horizontal scan distance is used to scan a beam across a wafer diameter. Current approaches use an estimation of the beam edge to estimate the total required horizontal scan distance. However, with no actual measurements being performed to confirm that the beam is sufficiently scanning across the wafer, over or under scanning of the wafer often occurs.

Therefore, it would be beneficial to ensure that the beam is sufficiently scanned over the entire wafer diameter to provide a uniform implant and to optimize the beam current utilized during the implant of a wafer. It is with respect to this and other considerations, the present disclosure is provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method may include providing a first Faraday cup position along a first side of an intended beam-scan area, providing a second Faraday cup position along a second side of the intended beam-scan area, scanning an ion beam along the first and second sides of the intended beam-scan area, measuring a first beam current of the ion beam at the first Faraday cup position and measuring a second beam current of the ion beam at the second Faraday cup position, and determining an optimal scan distance of the ion beam across the intended beam-scan area based on the first beam current and the second beam current.

In another embodiment, an apparatus for optimizing a scanned beam distance of an ion beam may include a beam scanner operable to scan a spot ion beam with respect to an intended beam-scan area, and a Faraday cup positioned along a first side of an intended beam-scan area and a Faraday profiler positioned along a second side of the intended beam-scan area, wherein the Faraday cup is operable to measure a first beam current of the spot ion beam and the Faraday profiler is operable to measure a second beam current of the spot ion beam. The apparatus may further include a beam calibration component, comprising a controller and a memory, the memory comprising a calibration routine, operative on the controller to determine an optimal scan distance of the ion beam based on the first beam current and the second beam current.

In yet another embodiment, a non-transitory computer-readable storage medium, the non-transitory computer-readable storage medium including instructions that when executed by a computer, cause the computer to scan, by a beam scanner, a spot ion beam with respect to an intended beam-scan area, measure a first beam current of the spot ion beam at a first Faraday cup positioned along a first side of the intended beam-scan area, and measure a second beam current of the spot ion beam at a second Faraday cup positioned along a second side of the intended beam-scan area. The computer-readable storage medium further includes instructions that when executed by the computer, cause the computer to determine an optimal scan distance of the ion beam based on the first beam current and the second beam current.

BRIEF DESCRIPTION OF THE DRAWINGS

By way of example, embodiments of the disclosure will now be described, with reference to the accompanying drawings, in which.

Figure 1:
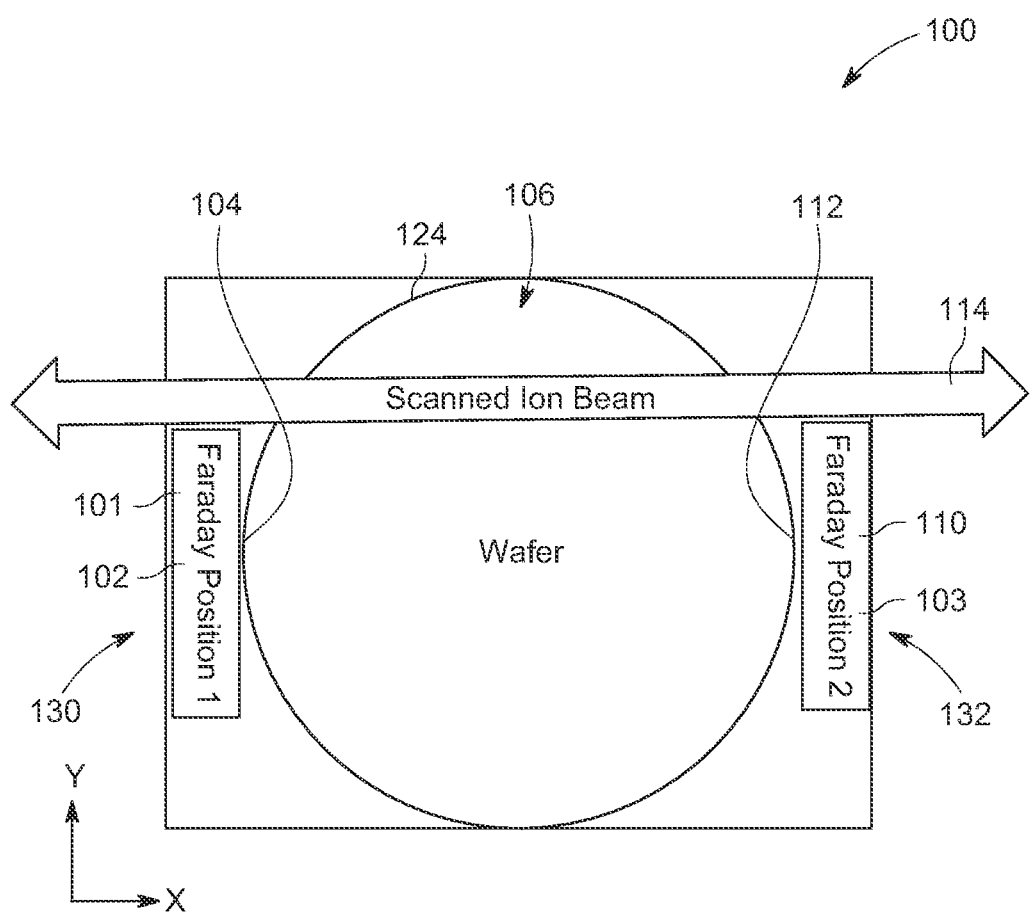
FIG. 1 is a system including a pair of Faraday cup positions for determining a scanned beam distance, in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. Instead, these embodiments are provided so this disclosure will be thorough and complete, and will fully convey the scope of the subject matter to those skilled in the art. In the drawings, like numbers refer to like elements throughout.

The embodiments described herein provide novel techniques to optimize a horizontal scan distance of an accelerator beam using beam current measurements from a set of Faraday cups positioned at opposite edges of a wafer. Unlike prior art approaches in which estimations of the beam edge are used in an attempt to determine the total required horizontal scan distance, embodiments of the present disclosure use actual beam current measurements with a Faraday cup positioned on each side of the wafer to determine the optimum scanned beam distance. This ensures the beam passes beyond the edges of the wafer and minimizes the additional over scanned distance. Advantageously, there is no wasted beam current when the beam is off the wafer, and the beam current is utilized/optimized during the implant of a wafer. Furthermore, embodiments herein ensure that the beam is sufficiently scanned over the entire wafer diameter to ensure uniform implant. Still furthermore, embodiments herein advantageously ensure accurate measurement of implant monitoring Faraday cup for dose accuracy.

FIG. 1 shows a first embodiment of an apparatus 100 for determining an optimal scan distance for an ion implanter. The apparatus 100 may include a Faraday cup 101 at a first Faraday cup position 102 along a first side 104 of an intended beam-scan area 106, and a Faraday cup or Faraday profiler 103 at a second Faraday cup position 110 along a second side 112 of the intended beam-scan area 106. In some embodiments, only Faraday cup 101 is present, and measurements are taken at multiple positions by single Faraday cup 101.

Although non-limiting, the Faraday cup 101 is generally fixed along the x-direction, while the Faraday profiler 103 may move horizontally along the x-direction. For example, the Faraday profiler 103 may be positioned inside or outside of the intended beam-scan area 106. The first Faraday cup 102 may include a first aperture (not shown) operable to receive an indication of a current of an ion beam 114 as the ion beam 114 is scanned horizontally (e.g., along the x-direction in the orientation shown) near the first side 104. The Faraday profiler 103 may similarly measure the current of the ion beam 114 as the ion beam 114 is scanned horizontally near the second side 112. As will be described further herein, the measurements obtained from the Faraday cup 101 and the Faraday profiler 103 may be used to determine when the beam current completely passes a specific location outside the intended beam-scan area 106, such as the first aperture of the Faraday cup 101. Although non-limiting, the ion beam 114 may be an accelerator spot beam. In some cases, the left and right edges of the ion beam 114 may be detected as it passes by the Faraday cup 101 and the Faraday profiler 103. These edges may be about 0.6% of the detected peak (not integrated current) of the spot ion beam 114.

The intended beam-scan area 106 may generally correspond to an area where a wafer is to be processed (e.g., scanned) by the ion beam 114. During use, the ion beam 114 may be scanned horizontally (e.g., in the x-direction), while the wafer may move vertically (e.g., along the y-direction). The implant area 106 may be defined by a perimeter 124, wherein the first side 104 and the second side 112 may correspond to circumferential opposite points along the perimeter 124. A diameter of the intended beam-scan area 106 may extend between the first side 104 and the second side 112. In the embodiment shown, the Faraday cup 101 is positioned outside of the perimeter 124, in a first overscan area 130, while the Faraday profiler 103 is positioned outside of the perimeter 124, in a second overscan area 132. The first overscan area 130 may include a first CLF dimension (CD1) corresponding to a length (e.g., along the x-direction) between the first aperture and the first side 104.

During use, the ion beam 114 is scanned between the first and second sides 104, 110 of the intended beam-scan area 106. A first beam current of the ion beam 114 may be measured at the first Faraday cup position 102 and a second beam current of the ion beam 114 may be measured at the second Faraday cup position 110 to determine an optimal scan distance of the ion beam across the intended beam-scan area 106 and across the first and second overscan areas 130, 132 based on the first beam current and the second beam current. Advantageously, by optimizing the horizontal scan distance, beam current can be increased. More specifically, embodiments herein decrease the horizontal scan distance as much as possible to maximize beam current for high dose recipes. In another example, the horizontal scan distance can be increased for low dose recipes, thus reducing the beam current. In other words, the apparatus 100 permits quick tuning of the horizontal scan distance to dial the beam current back to the target, so as the distance is not less than the minimum HSD.

Figure 2A:
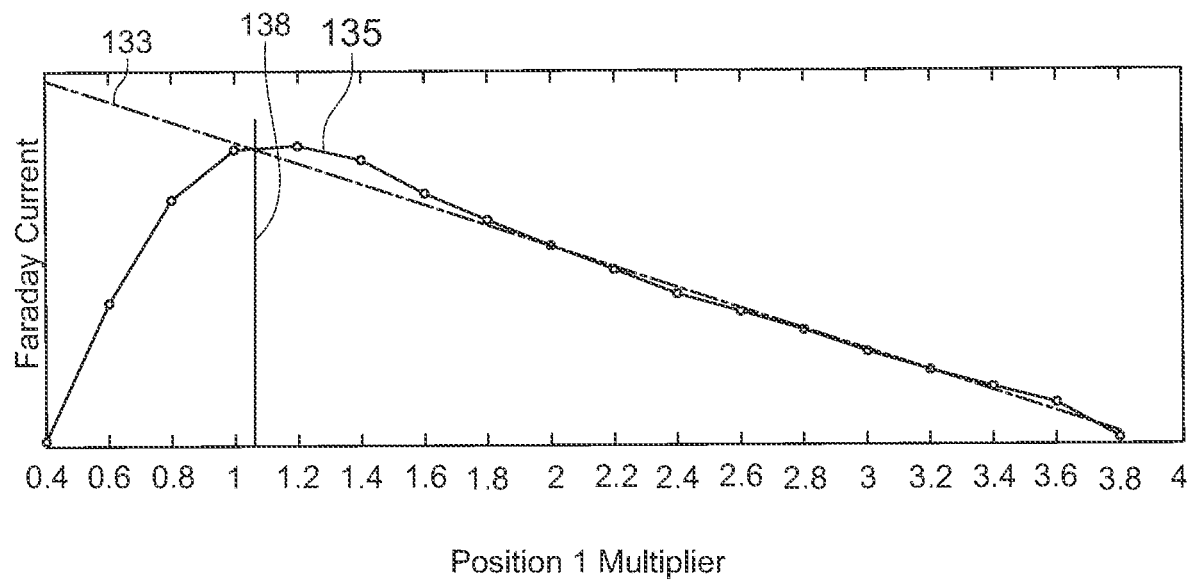
FIGS. 2A-2B are graphs illustrating current vs. a multiplier value, in accordance with embodiments of the present disclosure.

In one embodiment, the ion beam 114 may be scanned across a wide horizontal distance (e.g., from the first overscan area 130 to the second overscan area 132), and then slowly reduced in width in the horizontal direction, towards a center of the intended beam-scan area 106. FIG. 2A demonstrates a relationship between current and a first Faraday cup multiplier (hereinafter multiplier 1). As shown by reference line 133, current is expected to linearly increase as overscan is decreased. In other words, as the ion beam 114 moves away from the first overscan area 130 and towards the intended beam-scan area 106, current increases. Line 135, which tracks example current measurements by the Faraday cup 101, demonstrates a case in which overscan is insufficient, resulting in line 135 deviating from the reference line 133. To determine an appropriate value for multiplier 1, a current deviation above or below a first predetermined threshold may be used. For example, a scan location before 'x'% drop in current from an expected value (reference line 133) can be selected. In various examples, 'x' may be between 0.01 and 10. Therefore, multiplier 1 may be approximately 1.1 in this example, as demonstrated by line 138.

Figure 2B:
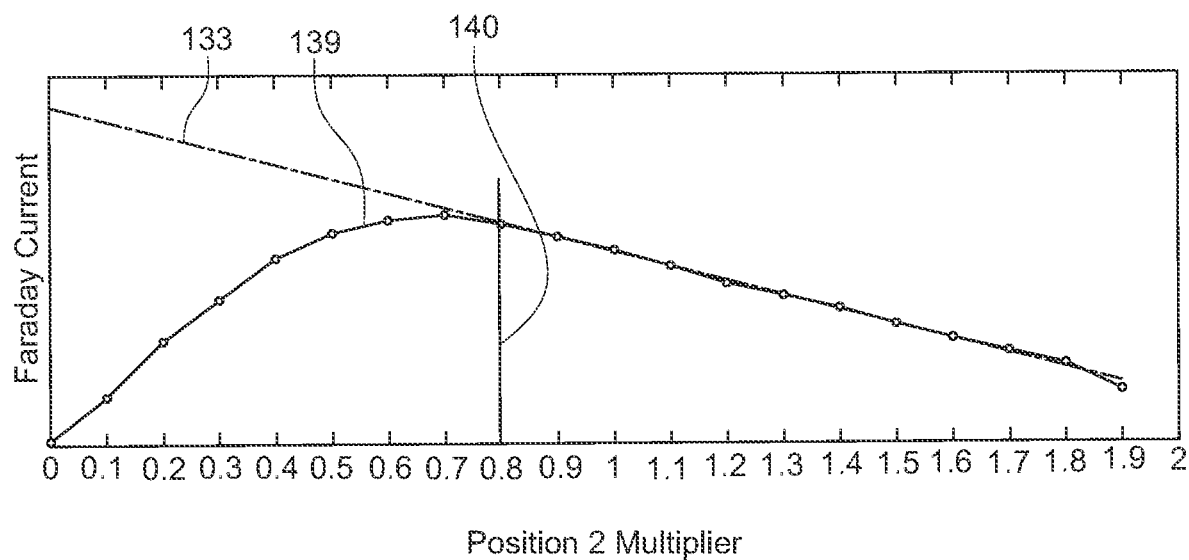

A similar analysis can be performed for the Faraday profiler 103, as shown in FIG. 2B. Reference line 133 corresponds to a linearly increasing expected current, while line 139 connects example current measurements by the Faraday profiler 103. To determine an appropriate value for a second Faraday cup multiplier (hereinafter multiplier 2), a current deviation above or below a second predetermined threshold may be used, in this case a scan location before 'x'% drop in current from an expected value (reference line 133). In various examples, 'x' may be between 0.01 and 10. Therefore, multiplier 2 may be approximately 0.8 in this example, as demonstrated by line 140.

Using equation (1) below, a dynamic horizontal scan distance (ScanWidthTotal) of the ion beam 114 may be determined for the intended beam-scan area 106, the first overscan area 130, and the second overscan area 132 of apparatus 100:

$$\text{ScanWidthTotal} = \text{Multipler1} * \text{Beam}_{width} + \text{CLF}_{distance} + \text{Wafer}_{Diameter} + \text{Multipler2} * \text{Beam}_{width} \quad (1)$$

In the above, $\text{Beam}_{width}$ is a measurable value, and may vary depending on the parameters of the ion beam 114.

Figure 3:
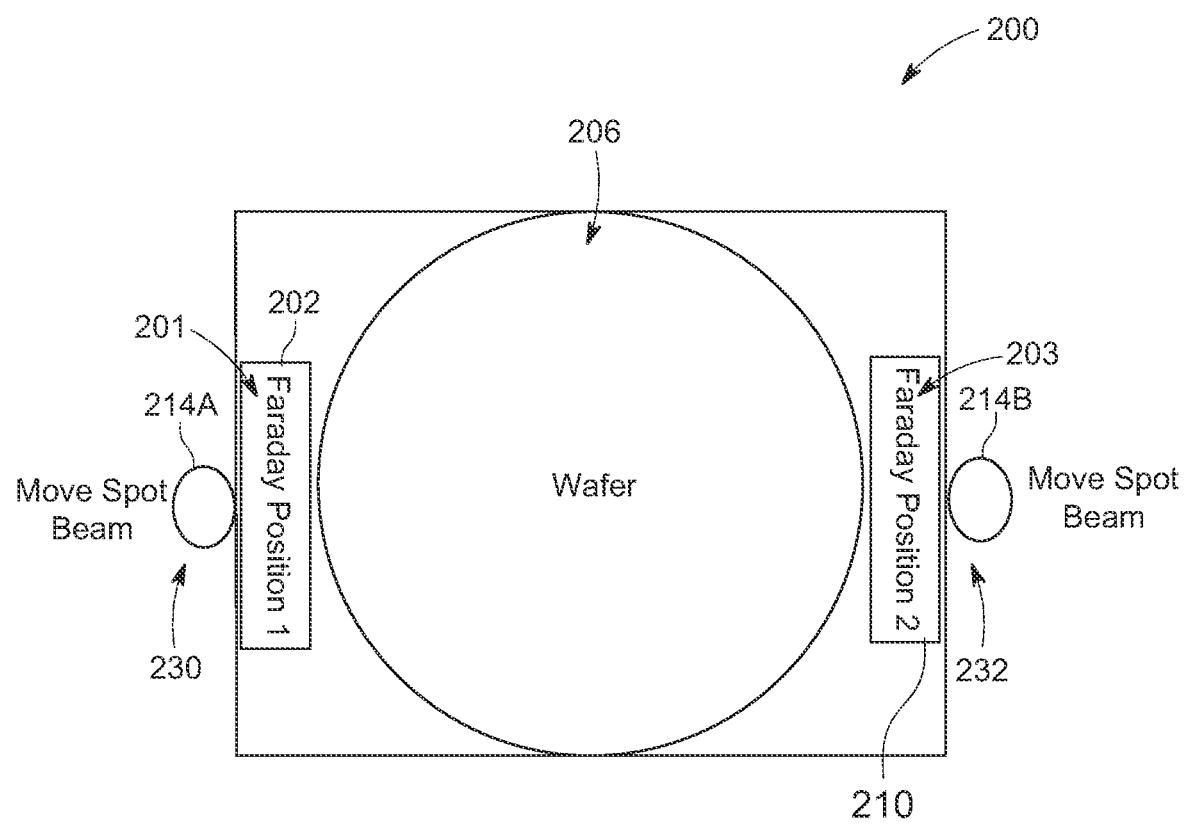
FIG. 3 is a system including a pair of Faraday cup positions for determining a scanned beam distance, in accordance with embodiments of the present disclosure.

FIG. 3 demonstrates another approach to determine horizontal scan distance for an apparatus 200. Apparatus 200 may be the same or similar to apparatus 100. As such, only certain aspects of apparatus 200 will hereinafter be described for the sake of brevity. In this embodiment, a set of stationary spot ion beams 214A, 214B are initially positioned in a first overscan area 230 and a second overscan area 232, respectively. The first ion beam 214A may be iteratively shifted towards a Faraday cup 201 at a first Faraday position 202 via a scanner commanded to a fixed position. The Faraday cup 201 measures an increase in current as the first ion beam 214A moves towards an intended beam-scan area 206. Similarly, the second ion beam 214B may be iteratively shifted towards a Faraday profiler 203 at a second Faraday position 210 via a scanner commanded to a fixed position. The Faraday profiler 203 measures an increase in current as the second ion beam 214B moves towards the intended beam-scan area 206. A scan distance can be set based on the point that each beam is outside the intended beam-scan area 206 and the Faraday cup 201 and the Faraday profiler 203 don't measure any increased beam current from a no-beam offset. Equation (1) above may again be used to calculate the horizontal scan distance.

Figure 4A:
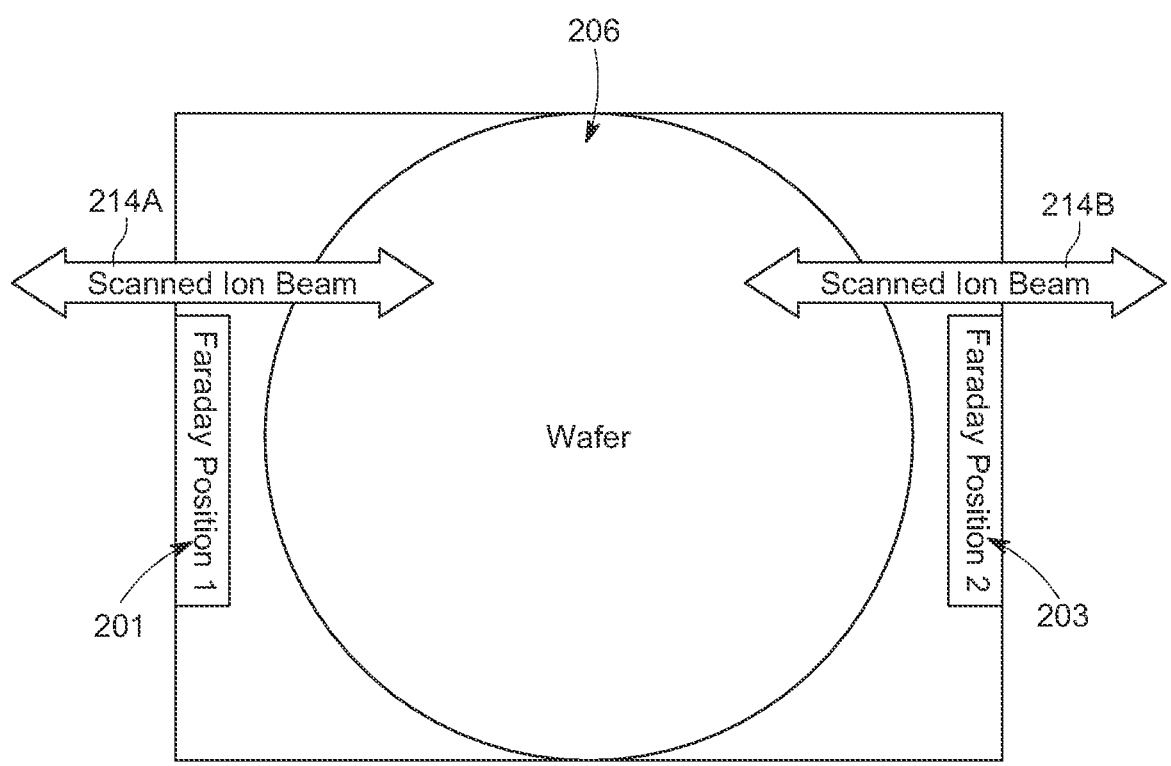
FIG. 4A is a system including a pair of Faraday cup positions for determining a scanned beam distance, in accordance with embodiments of the present disclosure.
Figure 4B:
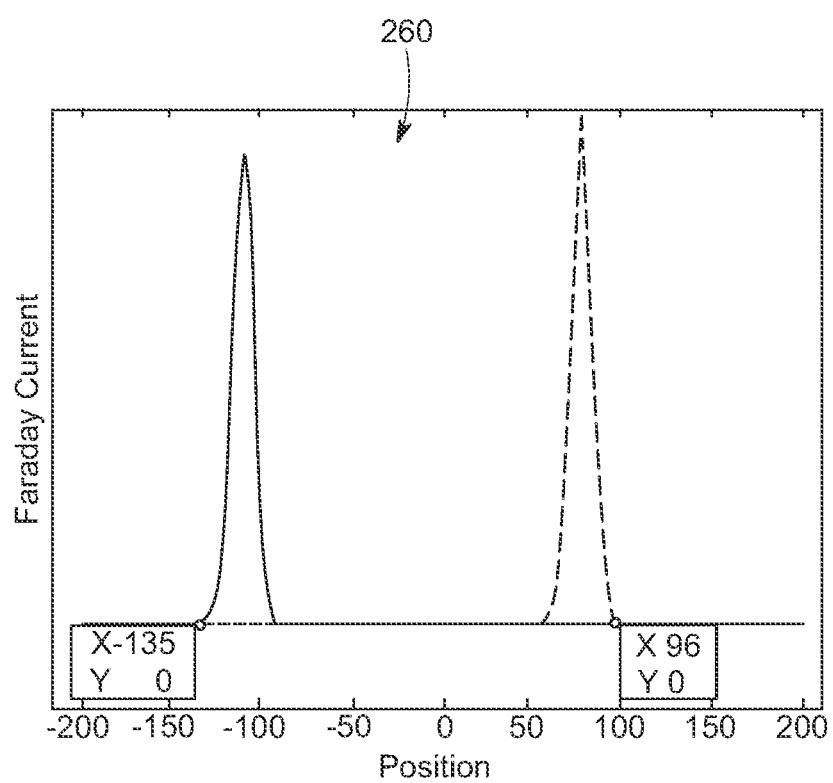
FIGS. 4B-4C are graphs illustrating current vs. position, in accordance with embodiments of the present disclosure.
Figure 4C:
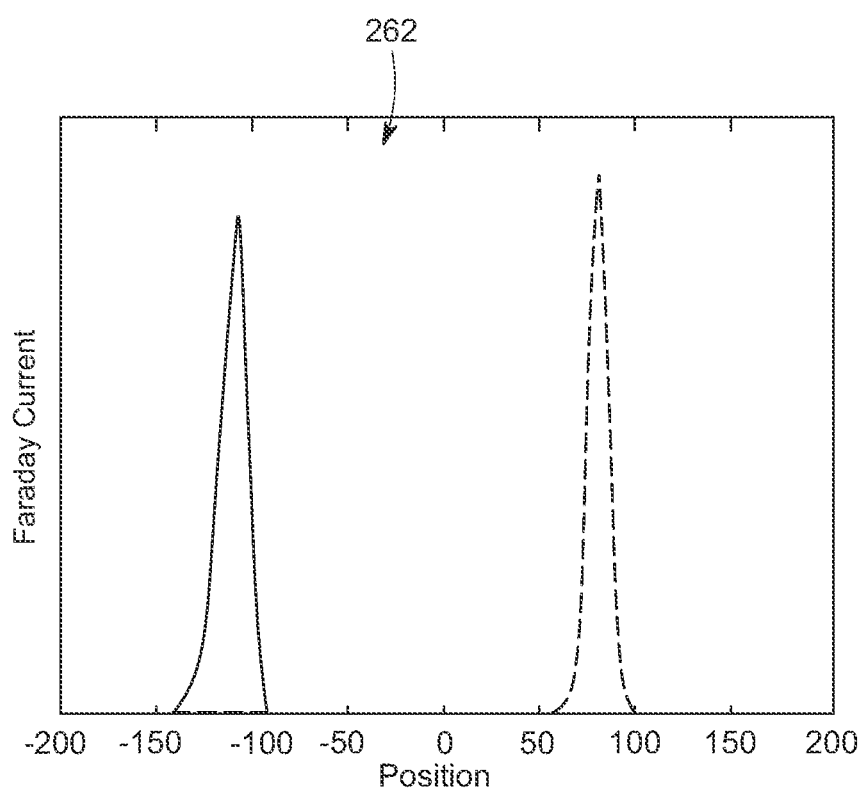

FIGS. 4A-4C demonstrate yet another approach to determine a dynamic horizontal scan distance of a "fast spot" beam. With a "fast spot" beam approach, spot beam 214A may be swept across the Faraday cup 201 several times, such as 16 times, to obtain an average current response as a fast Spot profile, which may require ~3 seconds. Similarly, spot beam 214B may be swept across the Faraday profiler 203 several times, such as 16 times, to obtain an average current response as a fast Spot profile. In this embodiment, a fast spot ion beam may be scanned around the CLF position (i.e., aperture) of the Faraday cup 201 to determine a current vs. position profile 260, as shown in FIB. 4B. The fast spot ion beam may be similarly scanned at the Faraday profiler 203 to determine the edge of the current at the edge of the intended beam-scan area 206 based on the current vs. position profile 262 shown in FIG. 4C. The fast spot data may then be used to determine the edge of measured current, wherein scan distance is then set based on the fast spot current measurement distances.

Figure 5:
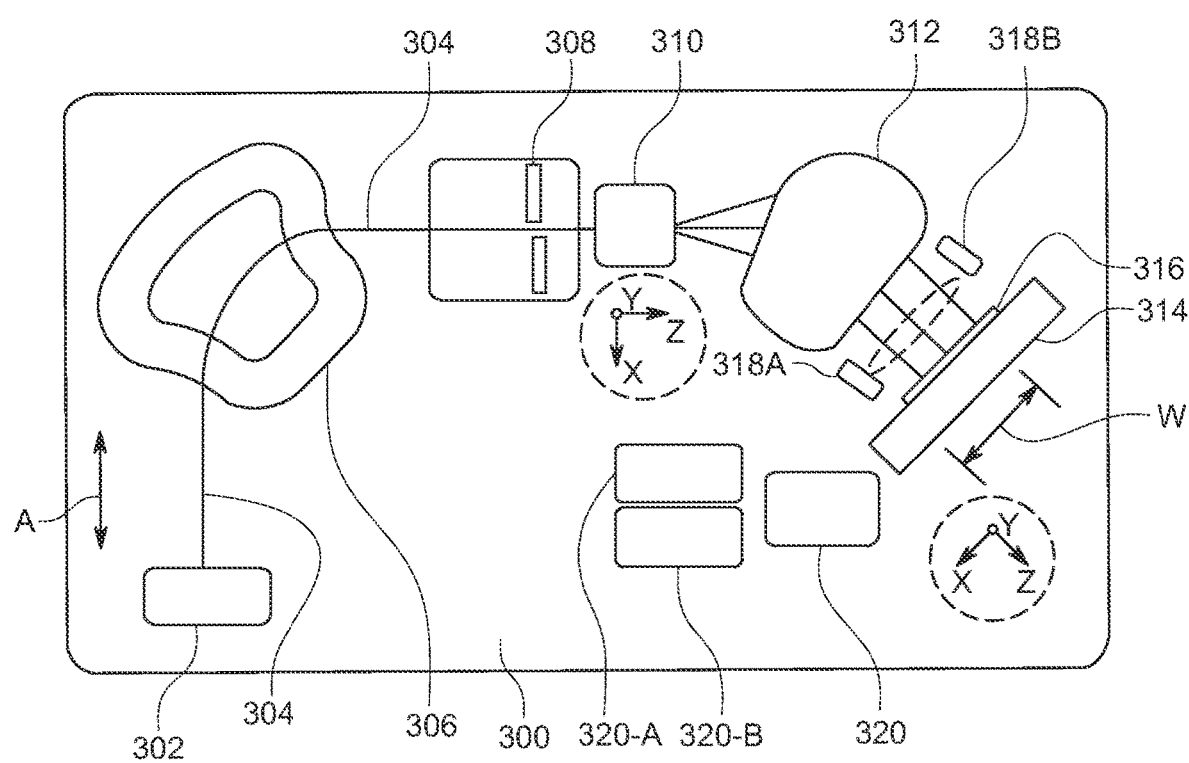
FIG. 5 depicts a top plan view in block form of a beamline ion implanter, in accordance with various embodiments of the disclosure.

FIG. 5 depicts a top plan view in block form of a beamline ion implanter, shown as the ion implanter 300, in accordance with various embodiments of the disclosure. The ion implanter 300 includes an ion source 302 configured to generate an ion beam 304. The ion beam 304 may be provided as a spot beam scanned along a direction, such as the X-direction. In the convention used herein, the Z-direction refers to a direction of an axis parallel to the central ray trajectory of an ion beam 304. Thus, the absolute direction of the Z-direction, as well as the X-direction, where the X-direction is perpendicular to the Z-direction, may vary at different points within the ion implanter 300 as shown. The ion beam 304 may travel through an analyzer magnet 306, mass resolving slit 308, and through a collimator 312 before impacting a substrate 316 disposed on substrate stage 314. The substrate stage 314 may be configured to scan the substrate 316 at least along the Y-direction in some embodiments. In the example shown in FIG. 5, the ion implanter 300 includes a beam scanner 310. When the ion beam 304 is provided as a spot beam, the beam scanner 310 may scan the ion beam 304 along the X-direction, producing a scanned ion beam, also scanned at the substrate along the X-direction. The width of the resulting scanned spot beam may be comparable to the width W of the substrate 316.

The ion implanter 300 further includes a set of current detectors 318A-318B, such as Faraday cup current detectors, and in particular closed loop Faraday current detector, for monitoring beam current provided to the substrate 316, and a profiler Faraday cup, for measuring the beam uniformity. The current detectors 318A-318B may be placed along opposite sides of the substrate 316 to intercept the ion beam 304 and may be configured to record beam current of the ion beam 304 during various horizontal scanned beam distance optimization operations, as discussed above.

The ion implanter 300 also includes a beam calibration component 320. The beam calibration component 320 may be coupled to the beam scanner 310 as well as current detectors 318A, 318B. The beam calibration component 320 may be coupled to one or more components to adjust scanning of the ion beam 304, in order to provide more uniform and efficient ion implantation into the substrate 316 as a result of beam distance optimization procedures. The beam calibration component 320 may include logic to determine a ScanWidthTotal based upon application of various beam measurements, and the application of routines based upon these measurements, as described in the aforementioned examples. The logic may further generate adjustment signals for adjusting scanning of the ion beam 304 based upon the determined ScanWidthTotal. In some instances, the logic of beam calibration component 320 may be implemented in a combination of software and hardware, or firmware. In some examples the beam calibration component 320 may include circuitry such as a controller 320-A and memory 320-B that is coupled to software to execute instructions for adjusting the scanning of ion beam 304, based upon the determination of the ScanWidthTotal. The embodiments are not limited in this context.

Figure 6:
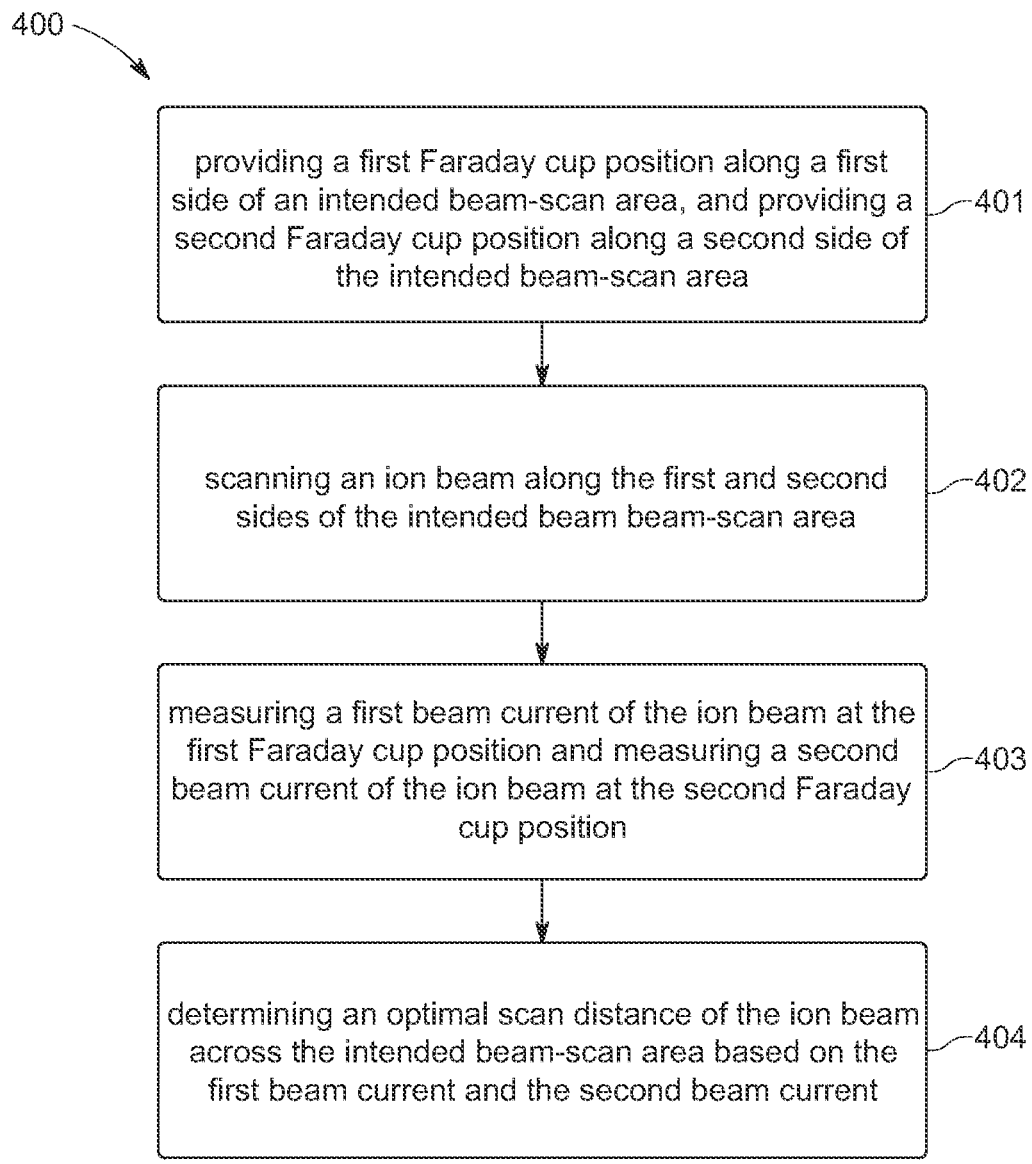
FIG. 6 depicts an exemplary process flow of a method, in accordance with various embodiments of the disclosure.

Turning to FIG. 6, a method 400 according to embodiments of the disclosure will be described. At block 401, the method 400 may include providing a first Faraday cup position along a first side of an intended beam-scan area, and providing a second Faraday cup position along a second side of the intended beam-scan area. In some embodiments, a Faraday cup may be located at the first Faraday cup position, and a Faraday profiler may be located at the second Faraday cup position. The first and second Faraday cup positions may be located along a same horizontal axis, at circumferentially opposite points of the intended beam-scan area.

At block 402, the method 400 may further include scanning an ion beam along the first and second sides of the intended beam-scan area. In some embodiments, the ion beam may be scanned entirely across the intended beam-scan area, the first Faraday cup position, and the second Faraday cup position. In some embodiments, the ion beam may be scanned only at the first and second Faraday cup positions. That is, a spot beam may be parked beyond each of the Faraday cup and the Faraday profiler and moved inwards towards the intended beam-scan area, stopping at an edge of the intended beam-scan area. This process may be performed using a fast spot beam operation.

At block 403, the method 400 may include measuring a first beam current of the ion beam at the first Faraday cup position and measuring a second beam current of the ion beam at the second Faraday cup position.

At block 404, the method 400 may include determining an optimal scan distance of the ion beam across the intended beam-scan area based on the first beam current and the second beam current. In some embodiments, determining the optimal scan distance includes scanning the ion beam beyond the first side of the intended beam-scan area until the ion beam fully passes a first aperture of the Faraday cup, and scanning the ion beam beyond the second side of the intended beam-scan area until the ion beam fully passes the Faraday profiler. In some embodiments, the method may further include determining that the ion beam has fully passed the first aperture of the Faraday cup when a first current measurement of the Faraday cup reaches a first predetermined threshold, and determining that the ion beam has fully passed the second aperture of the second Faraday cup when a second current measurement of the second Faraday cup reaches a second predetermined threshold.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Furthermore, identification references (e.g., primary, secondary, first, second, third, fourth, etc.) are not intended to connote importance or priority, but are used to distinguish one feature from another. The drawings are for purposes of illustration only and the dimensions, positions, order and relative sizes reflected in the drawings attached hereto may vary.

Still furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

What is claimed is:

1. A method, comprising:
providing a first Faraday cup position along a first side of an intended beam-scan area;
providing a second Faraday cup position along a second side of the intended beam-scan area;
scanning an ion beam along the first and second sides of the intended beam-scan area;
measuring a first beam current of the ion beam at the first Faraday cup position and measuring a second beam current of the ion beam at the second Faraday cup position;
determining a first overscan value by adding a first product and a length dimension measured between a first aperture of a first Faraday cup at the first Faraday cup position and the first side of the intended beam-scan area, wherein the first product is obtained by multiplying a beamwidth of the ion beam by a first multiplier, and wherein the first multiplier is determined from a first predetermined threshold of the first beam current of the ion beam at the first Faraday cup position; and
determining a second overscan value by multiplying the beamwidth with a second multiplier, wherein the second multiplier is determined from a second predetermined threshold of the second beam current of the ion beam at the second Faraday cup position.

2. The method of claim 1, wherein scanning the ion beam along the first and second sides of the intended beam-scan area comprises:
scanning the ion beam beyond the first side of the intended beam-scan area until the ion beam fully passes the first aperture of the first Faraday cup at the first Faraday cup position; and
scanning the ion beam beyond the second side of the intended beam-scan area until the ion beam fully passes the second Faraday cup position.

3. The method of claim 2, further comprising determining that the ion beam has fully passed the first aperture of the first Faraday cup when the first beam current of the first Faraday cup reaches the first predetermined threshold, and determining that the ion beam has fully passed the second Faraday cup position when the second beam current at the second Faraday cup position reaches the second predetermined threshold.

4. The method of claim 3, further comprising determining an optimal scan distance of the ion beam by
adding together the first overscan value, the second overscan value, and a diameter of the intended beam-scan area.

5. The method of claim 4, further comprising modifying a current of the ion beam based on the determined optimal scan distance of the ion beam.

6. The method of claim 2, wherein scanning the ion beam along the first and second sides of the intended beam-scan area comprises:

initially positioning the ion beam beyond the first Faraday cup in a first overscan area; and moving the ion beam towards the first side of the intended beam-scan area.

7. The method of claim 6, wherein scanning the ion beam along the first and second sides of the intended beam-scan area further comprises:

initially positioning the ion beam beyond the second Faraday cup position in a second overscan area; and moving the ion beam towards the second side of the intended beam-scan area.

8. An apparatus for optimizing a scanned beam distance of a spot ion beam, the apparatus comprising:

a beam scanner operable to scan the spot ion beam with respect to an intended beam-scan area;

a Faraday cup along a first side of an intended beam-scan area;

a Faraday profiler along a second side of the intended beam-scan area, wherein the Faraday cup is operable to measure a first beam current of the spot ion beam and the Faraday profiler is operable to measure a second beam current of the spot ion beam; and a beam calibration component, comprising a controller and a memory, the memory comprising a calibration routine, operative on the controller, to:

determine a first overscan value by adding a first product and a length dimension measured between a first aperture of the Faraday cup at a Faraday cup position and the first side of the intended beam-scan area, wherein the first product is obtained by multiplying a beamwidth of the spot ion beam by a first multiplier, and wherein the first multiplier is determined from a first predetermined threshold of the first beam current of the spot ion beam at the Faraday cup position; and determine a second overscan value by multiplying the beamwidth with a second multiplier, wherein the second multiplier is determined from a second predetermined threshold of the second beam current of the spot ion beam at a Faraday profiler position.

9. The apparatus of claim 8, wherein the beam scanner is operable to scan the spot ion beam along the first and second sides of the intended beam-scan area.

10. The apparatus of claim 9, wherein the beam scanner operable to scan the spot ion beam along the first and second sides of the intended beam-scan area is further operable to:

scan the spot ion beam beyond the first side of the intended beam-scan area until the spot ion beam fully passes the first aperture of the Faraday cup; and scan the spot ion beam beyond the second side of the intended beam-scan area until the spot ion beam fully passes the Faraday profiler.

11. The apparatus of claim 10, wherein the calibration routine is further operable on the controller to:

determine that the spot ion beam has fully passed the first aperture of the Faraday cup when the first beam current of the Faraday cup reaches the first predetermined threshold; and determine that the spot ion beam has fully passed the Faraday profiler when the second beam current of the Faraday profiler reaches the second predetermined threshold.

12. The apparatus of claim 8, wherein the calibration routine is further operable on the controller to determine an optimal scan distance of the spot ion beam by adding together the first overscan value, the second overscan value, and a diameter of the intended beam-scan area.

13. The apparatus of claim 8, wherein the beam scanner is further operable to:

initially position the spot ion beam beyond the Faraday cup in a first overscan area; and move the ion beam towards the first side of the intended beam-scan area.

14. The apparatus of claim 8, wherein the beam scanner is further operable to:

initially position the spot ion beam beyond the Faraday profiler in a second overscan area; and move the spot ion beam towards the second side of the intended beam-scan area.

15. A non-transitory computer-readable storage medium, the non-transitory computer-readable storage medium including instructions that when executed by a computer, cause the computer to:

scan, by a beam scanner, a spot ion beam with respect to an intended beam-scan area;

measure a first beam current of the spot ion beam at a first Faraday cup positioned along a first side of the intended beam-scan area, and measure a second beam current of the spot ion beam at a second Faraday cup positioned along a second side of the intended beam-scan area;

determine a first overscan value by adding a first product and a length dimension measured between a first aperture of a first Faraday cup at the first Faraday cup position and the first side of the intended beam-scan area, wherein the first product is obtained by multiplying a beamwidth of the ion beam by a first multiplier, and wherein the first multiplier is determined from a first predetermined threshold of the first beam current of the ion beam at the first Faraday cup position; and determine a second overscan value by multiplying the beamwidth with a second multiplier, wherein the second multiplier is determined from a second predetermined threshold of the second beam current of the ion beam at the second Faraday cup position.

16. The non-transitory computer-readable storage medium of claim 15, wherein the instructions further configure the computer to scan the spot ion beam along the first and second sides of the intended beam-scan area.

17. The non-transitory computer-readable storage medium of claim 15, wherein the instructions further configure the computer to:

scan the spot ion beam beyond the first side of the intended beam-scan area until the spot ion beam fully passes the first aperture of the first Faraday cup; and scan the spot ion beam beyond the second side of the intended beam-scan area until the spot ion beam fully passes a second aperture of the second Faraday cup.

18. The non-transitory computer-readable storage medium of claim 17, wherein the instructions further configure the computer to:

determine that the spot ion beam has fully passed the first aperture of the first Faraday cup when the first beam current of the first Faraday cup reaches the first predetermined threshold; and determine that the spot ion beam has fully passed the second aperture of the second Faraday cup when the second beam current of the second Faraday cup reaches the second predetermined threshold.

19. The non-transitory computer-readable storage medium of claim 15, wherein the instructions further configure the computer to determine an optimal scan distance of the spot ion beam by
adding together the first overscan value, the second overscan value, and a diameter of the intended beam-scan area.

20. The non-transitory computer-readable storage medium of claim 15, wherein the instructions further configure the computer to:
initially position the spot ion beam beyond the first Faraday cup in a first overscan area;
measure the first beam current as the spot ion beam moves towards the first side of the intended beam-scan area;
initially position the spot ion beam beyond the second Faraday cup in a second overscan area; and
measure the second beam current as the spot ion beam moves towards the second side of the intended beam-scan area.

\* \* \* \* \*